United States Patent
Sasaki

(10) Patent No.: US 10,644,119 B2
(45) Date of Patent: May 5, 2020

(54) COMPOUND SEMICONDUCTOR DEVICE

(71) Applicant: Mitsubishi Electric Corporation, Tokyo (JP)

(72) Inventor: Hajime Sasaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/308,495

(22) PCT Filed: Jan. 10, 2017

(86) PCT No.: PCT/JP2017/000453
§ 371 (c)(1),
(2) Date: Dec. 10, 2018

(87) PCT Pub. No.: WO2018/078894
PCT Pub. Date: May 3, 2018

(65) Prior Publication Data
US 2019/0273140 A1    Sep. 5, 2019

(30) Foreign Application Priority Data
Oct. 24, 2016 (JP) .................................. 2016-207849

(51) Int. Cl.
*H01L 29/40* (2006.01)
*H01L 29/20* (2006.01)
(Continued)

(52) U.S. Cl.
CPC ........ *H01L 29/408* (2013.01); *H01L 29/2003* (2013.01); *H01L 29/205* (2013.01);
(Continued)

(58) Field of Classification Search
CPC ............. H01L 29/7787; H01L 29/7786; H01L 29/778; H01L 29/205; H01L 29/405; H01L 29/404; H01L 29/402; H01L 29/42376
See application file for complete search history.

(56) References Cited

U.S. PATENT DOCUMENTS 5,374,843 A * 12/1994 Williams ............... H01L 23/585
257/335
9,306,014 B1 * 4/2016 Kudymov ............. H01L 29/404
(Continued)

FOREIGN PATENT DOCUMENTS

| JP | H02-113538 A | 4/1990 |
| JP | 2006-253654 A | 9/2006 |

(Continued)

OTHER PUBLICATIONS

International Search Report issued in PCT/JP2017/000453; dated Mar. 28, 2017.
(Continued)

*Primary Examiner* — Matthew L Reames
*Assistant Examiner* — John A Bodnar
(74) *Attorney, Agent, or Firm* — Studebaker & Brackett PC

(57) ABSTRACT

A semiconductor layer (2,3) is provided on a substrate (1). A gate electrode (4), a source electrode (5) and a drain electrode (6) are provided on the semiconductor layer (3). A first passivation film (7) covers the gate electrode (4) and the semiconductor layer (3). A source field plate (9) is provided on the first passivation film (7), and extends from the source electrode (5) to a space between the gate electrode (4) and the drain electrode (6). A second passivation film (10) covers the first passivation film (7) and the source field plate (9). The first passivation film (7) has a quasi-conductive thin film (8) provided at least between the gate electrode (4) and the
(Continued)

drain electrode (6) and having an electric resistivity of 1.0 $\Omega\text{cm}$ to $10^{10}$ $\Omega\text{cm}$.

2 Claims, 2 Drawing Sheets

(51) Int. Cl.
  *H01L 29/205* (2006.01)
  *H01L 29/778* (2006.01)
  *H01L 29/812* (2006.01)
(52) U.S. Cl.
  CPC .......... *H01L 29/402* (2013.01); *H01L 29/778* (2013.01); *H01L 29/7787* (2013.01); *H01L 29/812* (2013.01)

(56) References Cited

U.S. PATENT DOCUMENTS

| | | |
|---|---|---|
| 2006/0175670 A1 | 8/2006 | Tsubaki |
| 2010/0059798 A1 | 3/2010 | Kawasaki |
| 2012/0074577 A1 | 3/2012 | Nakanishi et al. |
| 2015/0340483 A1* | 11/2015 | Briere .................. H01L 29/404 257/194 |
| 2016/0268410 A1 | 9/2016 | Onizawa et al. |

FOREIGN PATENT DOCUMENTS

| | | |
|---|---|---|
| JP | 2008-243943 A | 10/2008 |
| JP | 2008-258419 A | 10/2008 |
| JP | 2010-067693 A | 3/2010 |
| JP | 2011-243632 A | 12/2011 |
| JP | 2015-170821 A | 9/2015 |
| JP | 2016-085999 A | 5/2016 |
| JP | 2016-171197 A | 9/2016 |
| WO | 2010/070824 A1 | 6/2010 |

OTHER PUBLICATIONS

Written Opinion issued in PCT/JP2017/000453; dated Mar. 28, 2017.

Notification of Transmittal of the International Search Report and the Written Opinion of the International Searching Authority, or the Declaration issued in PCT/JP2017/000453; dated Mar. 28, 2017.

An Office Action; "Notification of Reasons for Refusal," issued by the Japanese Patent Office dated Jun. 13, 2017, which corresponds to Japanese Patent Application No. 2017-521606.

* cited by examiner

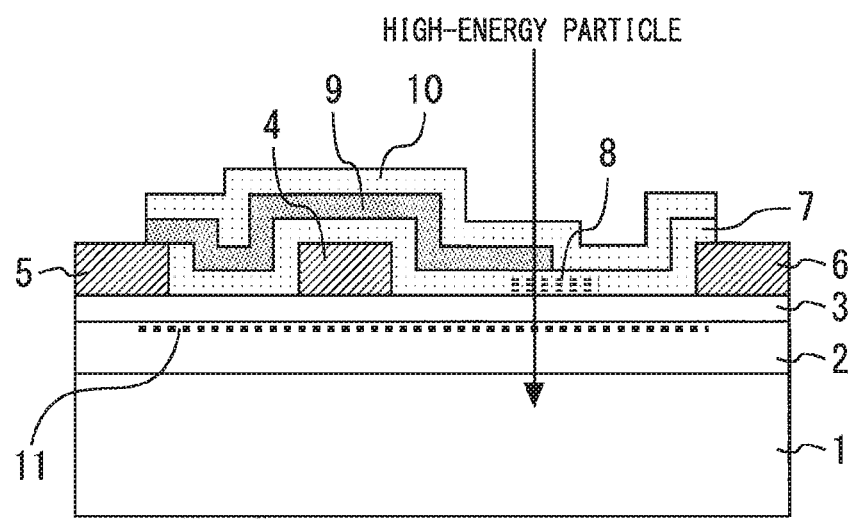
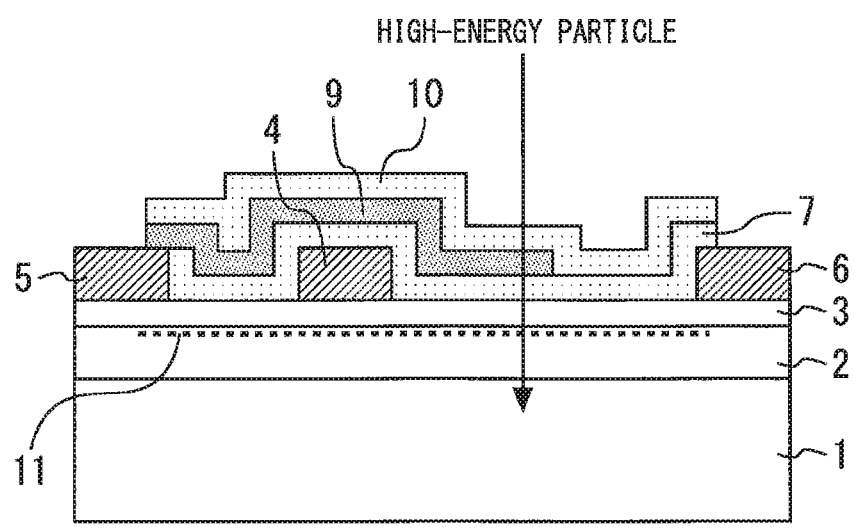

COMPOUND SEMICONDUCTOR DEVICE

FIELD

The present invention relates to a compound semiconductor device that is hard to be broken and deteriorated even under a severe environment exposed to high-energy particles.

BACKGROUND

A compound semiconductor device is used as a field effect transistor such as a MES-FET or a HEMT (for example, see PTL 1 to PTL 6). There is a case where a device is exposed to a severe environment, and high-energy particles are incident to the device, pass through a passivation film, a source field plate, and an active region of the device and reach a substrate. At this time, a large amount of electron-hole pairs are generated around a trajectory through which the high-energy particles have passed, and are diffused or recombined according to the mobility of material, a recombination speed, and an applied voltage.

CITATION LIST

Patent Literature

[PTL 1] JP H02-113538 A
[PTL 2] JP 2006-253654 A
[PTL 3] JP 2008-243943 A
[PTL 4] JP 2010-67693 A
[PTL 5] JP 2011-243632 A
[PTL 6] JP 2015-170821 A

SUMMARY

Technical Problem

A high electric field is applied between an end portion on a drain electrode side of a source field plate and an AlGaN channel layer. Therefore, when a large amount of electron-hole pairs are generated in the passivation film upon incidence of high-energy particles, a conduction path is formed at that portion, resulting in breakage of the device. Or, there has been a problem that the concentration of holes in the vicinity of the surface of a semiconductor increases in the process of diffusion and recombination of electron-hole pairs generated in the semiconductor, which causes an increase in potential or an increase in hole current, resulting in breakage or making deterioration easy. Likewise, there has been a problem that a high electric field is applied between an end portion on a drain electrode side of a gate electrode and the AlGaN channel layer, which makes breakage or deterioration easy.

The present invention has been made to solve the problems as described above, and has an object to obtain a compound semiconductor device that is hard to be broken and deteriorated even under a severe environment exposed to high-energy particles.

Solution to Problem

A compound semiconductor device according to the present invention includes: a substrate; a semiconductor layer provided on the substrate; a gate electrode, a source electrode and a drain electrode provided on the semiconductor layer; a first passivation film covering the gate electrode and the semiconductor layer; a source field plate provided on the first passivation film, and extending from the source electrode to a space between the gate electrode and the drain electrode; and a second passivation film covering the first passivation film and the source field plate, wherein the first passivation film has a quasi-conductive thin film provided at least between the gate electrode and the drain electrode and having an electric resistivity of 1.0 Ωcm to $10^{10}$ Ωcm.

Advantageous Effects of Invention

In the present invention, the first passivation film has a quasi-conductive thin film which is formed at least between the gate electrode and the drain electrode and has an electric resistivity of 1.0 Ωcm to $10^{10}$ Ωcm. Therefore, the present invention is hard to be broken and deteriorated even under a severe environment exposed to high-energy particles.

BRIEF DESCRIPTION OF THE DRAWINGS

FIG. 1 is a cross-sectional view showing a compound semiconductor device according to a first embodiment of the present invention.

FIG. 2 is a cross-sectional view showing a compound semiconductor device according to the comparative example.

DESCRIPTION OF EMBODIMENTS

Figure 3:
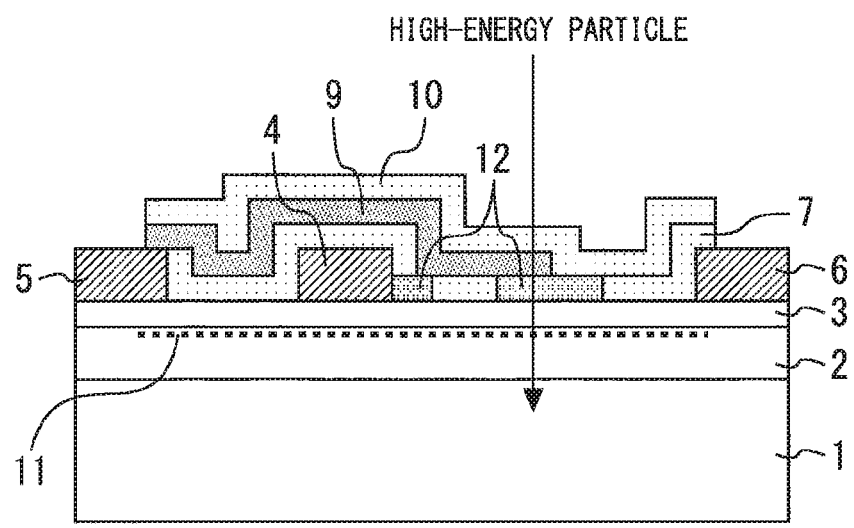
FIG. 3 is a cross-sectional view showing a compound semiconductor device according to a second embodiment of the present invention.

A compound semiconductor device according to the embodiments of the present invention will be described with reference to the drawings. The same components will be denoted by the same symbols, and the repeated description thereof may be omitted.

First Embodiment

FIG. 1 is a cross-sectional view showing a compound semiconductor device according to a first embodiment of the present invention. A GaN buffer layer 2 is formed on an SiC substrate 1. An AlGaN channel layer 3 is formed on the GaN buffer layer 2. A gate electrode 4, a source electrode 5, and a drain electrode 6 are formed on the AlGaN channel layer 3.

A first passivation film 7 covers the gate electrode 4 and the AlGaN channel layer 3. The first passivation film 7 has a quasi-conductive thin film 8 which is formed at least between the gate electrode 4 and the drain electrode 6, and has an electric resistivity of 1.0 Ωcm to $10^{10}$ Ωcm.

A source field plate 9 is formed on the first passivation film 7, and extends from the source electrode 5 to a space between the gate electrode 4 and the drain electrode 6. The source field plate 9 relaxes the electric field between the gate electrode 4 and the drain electrode 6, enables a high voltage operation, and further reduces a parasitic capacitance, thereby improving high frequency characteristics. In order to protect the entire device, a second passivation film 10 covers the first passivation film 7 and the source field plate 9.

When a voltage is applied between the source electrode 5 and the drain electrode 6, and a high frequency is input to the gate electrode 4 while a desired bias voltage is applied to the gate electrode 4, and electrons in two-dimensional electron gas 11 move at a high speed, whereby the compound semiconductor device operates as an amplifier capable of obtaining an amplified high frequency power from the drain electrode 6.

Normally, the passivation film is formed of silicon nitride (SiN), and the composition ratio of atoms thereof is set approximately to almost a stoichiometric composition ($Si_3N_4$) so that the passivation film is an insulator. The same is also applied in a case where silicon oxide (SiO) is used. The passivation film is often formed by a plasma CVD method, a Cat-CVD method (Catalytic Chemical Vapor Deposition), an ALD method (Atomic Layer Deposition), a PLD method (Pulsed Laser Deposition), or the like. $SiH_4$, $NH_3$, and $N_2$ are often used as gases for film formation in the plasma CVD method, and $H_2$ or the like is often used as a carrier gas. In the ALD method, for example, an organic raw material such as ethylmethylamino silane is used. In the PLD method, a Si substrate is often used as a target. In the case of the plasma CVD method, the composition ratio of SiN can be controlled by a gas concentration ratio, a gas pressure during film formation, a substrate temperature, a film formation rate, a plasma intensity, and the like, and it is usually controlled to be close to that of $Si_3N_4$, so that an insulating property is secured. In the ALD method and the PLD method, the composition ratio is also controlled by changing similar film formation parameters. For example, when a mixture gas of $SiH_4$ and $NH_3$ is used in the plasma CVD method, an Si-rich passivation film having a high Si composition ratio can be manufactured by intentionally increasing the concentration ratio of $SiH_4$. Since an Si-rich SiN film contains Si excessively, the metallicity thereof intensifies, and thus the Si-rich SiN film exhibits slight conductivity, that is, quasi-conductivity. This is a quasi-conductive thin film 8. That is, the quasi-conductive thin film 8 is Si-rich SiN, and the Si/N ratio thereof is larger than 0.75 in the case of $Si_3N_4$ which is the stoichiometric composition ratio.

Subsequently, an effect of the present embodiment will be described in comparison with a comparative example. FIG. 2 is a cross-sectional view showing a compound semiconductor device according to the comparative example. The first passivation film 7 of the comparative example does not have the quasi-conductive thin film 8. When high-energy particles are incident to the device, the high-energy particles may pass through the second passivation film 10, the source field plate 9, the first passivation film 7, the AlGaN channel layer 3, and the GaN buffer layer 2 and reach the SiC substrate 1. Incoming particles are heavy particles, protons, electrons, neutrons, muons, etc., and have energy of about 1 keV to 100 GeV. A large amount of electron-hole pairs are generated around a trajectory through which high-energy particles have passed. When a bundle of electron-hole pairs generated in the first passivation film 7 connectively extends from the source field plate 9 to the AlGaN channel layer 3, the insulating property deteriorates, and an applied bias leads to breakage of the device.

Furthermore, holes of the electron-hole pairs generated in AlGaN channel layer 3 or GaN buffer layer 2 are lower in mobility than electrons of the electron-hole pairs. Since the band structure of the AlGaN channel layer 3 is pinned near the surface thereof, the holes are easily diffused to the surface. Furthermore, the holes are attracted to zero potential of the source field plate 9, and tend to accumulate near the surface. The accumulating holes act to open the channel with an excessive charge collection effect, and also the holes themselves are attracted to gate potential to drift with high density on the surface, which damages the semiconductor.

On the other hand, in the present embodiment, the first passivation film 7 has a quasi-conductive thin film 8 which is formed at least between the gate electrode 4 and the drain electrode 6 and has an electric resistivity of 1.0 $\Omega$cm to $10^{10}$ $\Omega$cm. Electron-hole pairs generated upon incidence of high-energy particles can be promptly diffused in a lateral direction by the quasi-conductive thin film 8 to suppress formation of a current path in a vertical direction, thereby preventing the device from being broken due to dielectric breakdown. Furthermore, holes accumulated on the surface of the semiconductor are broadly diffused by the quasi-conductive thin film 8 to reduce the hole density, so that an increase in potential and an increase in hole current can be suppressed. Therefore, the compound semiconductor device according to the present embodiment is hard to be broken and deteriorated even under a severe environment exposed to high-energy particles.

Furthermore, the quasi-conductive thin film 8 is provided at an end portion on the drain electrode 6 side of the source field plate 9. The quasi-conductive thin film 8 may be provided at an end portion on the drain electrode 6 side of the gate electrode 4. As a result, it is possible to prevent dielectric breakdown particularly at a portion where the electric field is estimated to concentrate. However, the whole first passivation film 7 may be formed as the quasi-conductive thin film 8.

Furthermore, the quasi-conductive thin film 8 is not uniform in the thickness direction of the first passivation film 7, but the quasi-conductive thin film 8 and an SiN insulating film are stacked in the form of a laminate. Therefore, since the quasi-conductive thin film 8 has conductivity in the lateral direction, but has no conductivity in the vertical direction, it does not affect any normal device operation. When the electric resistivity of the quasi-conductive thin film 8 is as high as $10^5$ $\Omega$cm or more, it is unnecessary to make the quasi-conductive thin film 8 in the form of a laminate because leak components in the vertical direction are small. Accordingly, by making the entire film as the uniform quasi-conductive thin film 8, the first passivation film 7 can be simply manufactured. Furthermore, since the device does not perform the normal operation at the moment of irradiation, leakage at the portion of the quasi-conductive thin film 8 is negligible. The foregoing effect is exerted for incident particles from all directions, not only in a case where high-energy particles are incident from the upper surface of the device, but also in a case where high-energy particles are obliquely incident.

Second Embodiment

FIG. 3 is a cross-sectional view showing a compound semiconductor device according to a second embodiment of the present invention. In the present embodiment, the first passivation film 7 has a strongly correlated electron system material 12 formed at least between the gate electrode 4 and the drain electrode 6 instead of the quasi-conductive thin film 8. Representative examples of the strongly correlated electron system material 12 are $VO_2$, $SrTiO_3$, $LaVO_3$, SrO, etc., and many materials showing strong correlation such as copper oxide type, Fe type, Mn type, and superconducting type have been reported. The strongly correlated electron system material 12 is an MOTT insulator exhibiting insulation properties although it is filled with electrons under a normal state because the electrons have excessively strong correlation and thus do not freely move therein. It is known that when the strongly correlated electron system material 12 is stimulated with a voltage, temperature, light or the like, it conducts phase transition to a conductive material. Since the strongly correlated electron system material 12 can be formed and processed by a method which is usually used in a semiconductor process such as the PLD method, it can be easily incorporated into an existing semiconductor manufacturing process.

As in the case of the first embodiment, when high-energy particles are incident, a large amount of electron-hole pairs are generated in the device. At this time, the strongly correlated electron system material 12 changes to conductivity upon reception of the high-energy particles, the generated electron-hole pairs, or a stimulus of potential variation in the device. The electron-hole pairs generated in the device flow and diffuse through the strongly correlated electron system material 12 which has been changed to a conductive material, whereby high density accumulation is suppressed. As a result, breakage and deterioration of the device can be prevented.

Furthermore, since the strongly correlated electron system material 12 exhibits conductivity only at the moment when high-energy particles are incident, it does not affect the normal operation. Since the normal operation is not performed at the moment of irradiation, leakage at the portion of the strongly correlated electron system material 12 is negligible.

The strongly correlated electron system material 12 is provided at the end portion on the drain electrode 6 side of the gate electrode 4 and the end portion on the drain electrode 6 side of the source field plate 9. As a result, it is possible to prevent dielectric breakdown particularly at a portion where the electric field is estimated to concentrate. However, the entire first passivation film 7 may be made of a strongly correlated electron system material. The same effect can be obtained by using a metal oxide used in ReRAM instead of the strongly correlated electron system material 12.

Third Embodiment

Figure 4:
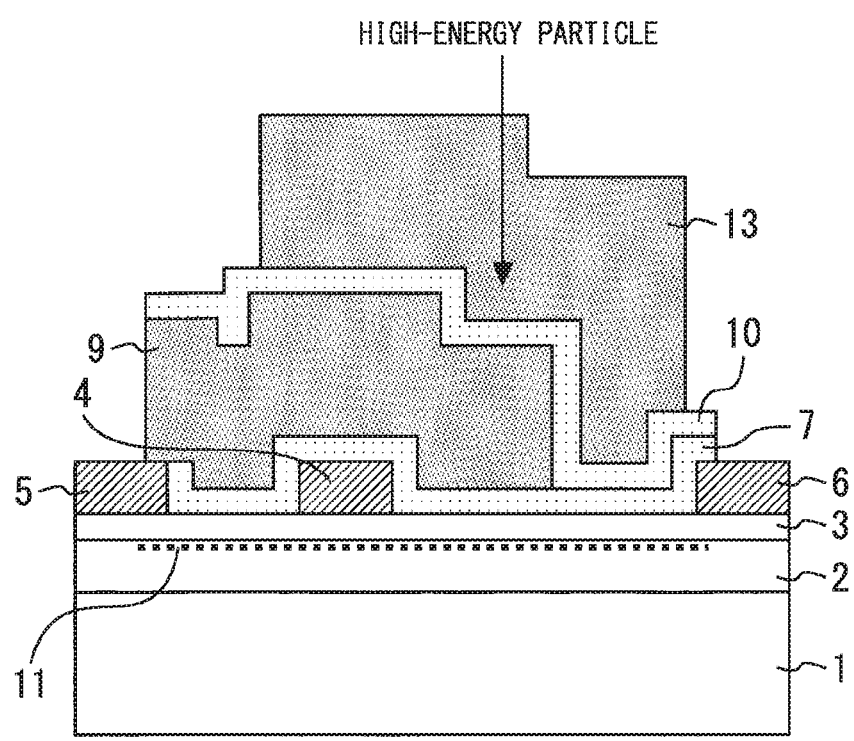
FIG. 4 is a cross-sectional view showing a compound semiconductor device according to a third embodiment of the present invention.

FIG. 4 is a cross-sectional view showing a compound semiconductor device according to a third embodiment of the present invention. In the present embodiment, the source field plate 9 is thickened from 5 μm to 100 μm in thickness. Since the thickness of the source field plate 9 is irrelevant to the improvement of the device characteristics, the thickness is usually set to several μm or less in order to reduce the manufacturing cost, and there is no example in which the film thickness is intentionally increased.

Furthermore, a thick film metal 13 having a thickness of 5 μm to 100 μm is formed on the second passivation film 10. Although a structure in which plural source field plates are stacked has been reported, this thick film metal 13 is not electrically connected to other electrodes. It is preferable that the thicknesses of the source field plate 9 and the thick film metal 13 are in a range from 10 μm to 100 μm.

For example, in an environment such as a space environment where high-energy particles are irradiated, the amount of iron particles is largest among incoming heavy particles, and a large amount of particles having energies up to 50 MeV are irradiated. The range of such particles is equal to 4.21 μm in the source field plate 9 and the thick film metal 13 which are formed of gold or the like. Accordingly, when the thicknesses of the source field plate 9 and the thick film metal 13 are equal to 5 μm or more, it is possible to prevent passage of particles therethrough. When calculating for xenon (Xe) which is a heavy particle having a large influence on a device as an example, the range at 1 MeV is equal to about 0.2 μm, the range at 35 MeV is equal to about 5 μm, and the range at 450 MeV is equal to about 20 μm. It is known that the irradiation probability decreases as the energy increases under severe environments, and most of incident high-energy particles stop in the source field plate 9 or the thick film metal 13, each having a thickness of several tens of μm. On the other hand, when the thickness is larger than 100 μm, manufacturing becomes difficult.

As described above, in the present embodiment, since the high-energy particles stop in the source field plate 9 or the thick film metal 13 and do not reach the semiconductor, breakage and deterioration of the device can be prevented. Furthermore, even when high-energy particles are incident into the electrically-isolated thick film metal 13, the device is not affected. Even when high-energy particles are incident into the source field plate 9 connected to the ground through the source electrode 5, charges flow to the ground, and the device is not affected.

Only one of the thickening of the source field plate 9 and the addition of the thick film metal 13 may be adopted, and either of them may be a thin film having a normal thickness. Also, gold is generally used as a material thereof, but the same effect can be obtained insofar as the material is a metal used in a normal semiconductor process such as copper, aluminum or WSi. An insulating film or an organic film may be used instead of metal insofar as the films have a high atom stopping ability.

REFERENCE SIGNS LIST

1 SiC substrate; 2 GaN buffer layer; 3 AlGaN channel layer; 4 gate electrode; 5 source electrode; 6 drain electrode; 7 first passivation film; 8 quasi-conductive thin film; 9 source field plate; 10 second passivation film; 12 strongly correlated electron system material; 13 thick film metal

The invention claimed is:

1. A compound semiconductor device comprising:
a substrate;
a semiconductor layer provided on the substrate;
a gate electrode, a source electrode and a drain electrode provided on the semiconductor layer;
a first passivation film covering the gate electrode and the semiconductor layer;
a source field plate provided on the first passivation film, and extending from the source electrode to a space between the gate electrode and the drain electrode; and
a second passivation film covering the first passivation film and the source field plate,
wherein the first passivation film has a strongly correlated electron system material provided at least between the gate electrode and the drain electrode, and
when a high-energy particle is incident to the strongly correlated electron system material, the strongly correlated electron system material conducts phase transition to a conductive material.

2. The compound semiconductor device according to claim 1, wherein the strongly correlated electron system material is provided at at least one of an end portion on the drain electrode side of the gate electrode and an end portion on the drain electrode side of the source field plate.

* * * * *